(12) United States Patent
Chien et al.

(10) Patent No.: US 12,407,305 B2
(45) Date of Patent: Sep. 2, 2025

(54) AMPLIFIER OUTPUT STAGE WITH DC-SHIFTING CIRCUIT FOR HIGH-SPEED SUPPLY MODULATOR

(71) Applicant: MEDIATEK INC., Hsin-Chu (TW)

(72) Inventors: Shih-Hsiung Chien, Hsinchu (TW); Sung-Han Wen, Hsinchu (TW); Kuan-Ta Chen, Hsinchu (TW)

(73) Assignee: MEDIATEK INC., Hsinchu (TW)

( * ) Notice: Subject to any disclaimer, the term of this patent is extended or adjusted under 35 U.S.C. 154(b) by 479 days.

(21) Appl. No.: 17/884,589

(22) Filed: Aug. 10, 2022

(65) Prior Publication Data

US 2023/0078955 A1 Mar. 16, 2023

Related U.S. Application Data

(60) Provisional application No. 63/243,765, filed on Sep. 14, 2021.

(51) Int. Cl.
*H03F 3/04* (2006.01)
*H03G 3/20* (2006.01)
*H03F 1/02* (2006.01)

(52) U.S. Cl.
CPC .............. *H03F 3/04* (2013.01); *H03F 1/0211* (2013.01); *H03F 1/0244* (2013.01)

(58) Field of Classification Search
CPC ........ H03F 3/04; H03F 3/19; H03F 2200/102; H03F 2203/30021; H03F 2203/30078;
(Continued)

(56) References Cited

U.S. PATENT DOCUMENTS 4,864,249 A * 9/1989 Reiffin ................... H03F 3/3076
330/268
5,512,859 A * 4/1996 Moraveji ............... H03F 3/4521
330/261
(Continued)

FOREIGN PATENT DOCUMENTS

| CN | 110311636 A | 10/2019 |
| EP | 3 367 564 B1 | 3/2021 |
| EP | 3 425 795 B1 | 9/2021 |

OTHER PUBLICATIONS

Chen-Yen Ho , "An 87.1% Efficiency RF-PA Envelope-Tracking Modulator for 80MHz LTE-Advanced Transmitter and 31dBm PA Output Power for HPUE in 0.153um CMOS", 2018 IEEE International Solid-State Circuits Conference ,2018.
(Continued)

*Primary Examiner* — Khanh V Nguyen
(74) *Attorney, Agent, or Firm* — Winston Hsu

(57) ABSTRACT

The present invention provides a linear amplifier including an amplifier stage, a DC-shifting stage, a compensation network and a power stage. The amplifier stage is configured to generate a first signal and a second signal. The DC-shifting stage is configured to adjust a DC voltage of the first signal and a DC voltage of the second signal to generate an adjusted first signal and an adjusted second signal. The compensation network is configured to generate a first driving signal and a second driving signal according to the first signal, the second signal, the adjusted first signal and the adjusted second signal. The power stage is configured to generate an output signal according to the first driving signal and the second driving signal.

10 Claims, 4 Drawing Sheets

(58) Field of Classification Search
CPC ......... H03F 2203/30111; H03F 1/0227; H03F 3/213; H03F 3/265; H03F 3/303; H03F 3/26; H03F 3/3088; H03F 1/22; H03F 3/3076; H03F 3/3066; H03F 3/3071; H03F 3/45475; H03F 3/45183; H03F 3/45479; H03F 3/45071; H03F 1/34; H03F 3/45085
USPC .................................................. 330/259–263
See application file for complete search history.

(56) References Cited

U.S. PATENT DOCUMENTS

| | | | |
|---|---|---|---|
| 8,008,975 B1 * | 8/2011 | Allen | .................... H03F 1/0216 330/296 |
| 8,421,531 B2 | 4/2013 | Jones et al. | |
| 9,246,449 B2 | 1/2016 | Williams | |
| 11,099,589 B1 | 8/2021 | Laur | |
| 2007/0096805 A1 | 5/2007 | Kim | |
| 2018/0120876 A1 | 5/2018 | Petenyi | |

OTHER PUBLICATIONS

Parisa Mahmoudidaryan ,"A 91%-Efficiency Envelope-Tracking Modulator Using Hysteresis-Controlled Three-Level Switching Regulator and Slew-Rate-Enhanced Linear Amplifier for LTE-80MHz Applications", 2019 IEEE International Solid-State Circuits Conference ,2019.

Parisa Mahmoudidaryan et al., Wideband Hybrid Envelope Tracking Modulator With Hysteretic-Controlled Three-Level Switching Converter and Slew-Rate Enhanced Linear Amplifier, IEEE Journal of Solid-State Circuits, vol. 54, No. 12, Dec. 2019, p. 3336-3347, XP011752832, Dec. 2019.

C.L. Britton, Jr. et al., A Four-Channel Bipolar Monolithic Preamplifier for RHIC Dimuon Pad Readout, Conference Record of the 1991 IEEE Nuclear Science Symposium and Medical Imaging Conference, Nov. 2-9, 1991, p. 639-643, Santa Fe, New Mexico USA, vol. 1 of 3, XP000347920.

* cited by examiner

US 12,407,305 B2

AMPLIFIER OUTPUT STAGE WITH DC-SHIFTING CIRCUIT FOR HIGH-SPEED SUPPLY MODULATOR

CROSS REFERENCE TO RELATED APPLICATIONS

This application claims the benefit of U.S. Provisional Application No. 63/243,765, filed on Sep. 14, 2021. The content of the application is incorporated herein by reference.

BACKGROUND

In a conventional linear amplifier used in a power modulator, an amplifier output stage within the linear amplifier is directly coupled to a power stage for generating a supply voltage. In the design of the power stage, a quiescent current is determined based on a gate-source voltage (Vgs) of the transistor within the power stage, that is, the power stage has lower quiescent current if the transistors have small gate-source voltages, and the power stage has larger quiescent current if the transistors have large gate-source voltages. However, because the transistors of the power stage receive output signals of the amplifier stage, if the transistors of the power transistor stage are designed to have small gate-source voltages to lower the quiescent current, the linearity of the amplifier stage will be worsened and the swings of output signals become smaller. Therefore, the linear amplifier has a trade-off between the quiescent current of the power stage and the linearity of the amplifier stage.

SUMMARY

It is therefore an objective of the present invention to provide a linear amplifier using a DC-shifting stage to de-couple the amplifier stage, to solve the above-mentioned problems.

According to one embodiment of the present invention, a linear amplifier comprising an amplifier stage, a DC-shifting stage, a compensation network and a power stage. The amplifier stage is configured to generate a first signal and a second signal. The DC-shifting stage is configured to adjust a DC voltage of the first signal and a DC voltage of the second signal to generate an adjusted first signal and an adjusted second signal. The compensation network is configured to generate a first driving signal and a second driving signal according to the first signal, the second signal, the adjusted first signal and the adjusted second signal. The power stage is configured to generate an output signal according to the first driving signal and the second driving signal.

These and other objectives of the present invention will no doubt become obvious to those of ordinary skill in the art after reading the following detailed description of the preferred embodiment that is illustrated in the various figures and drawings.

DETAILED DESCRIPTION

Certain terms are used throughout the following description and claims to refer to particular system components. As one skilled in the art will appreciate, manufacturers may refer to a component by different names. This document does not intend to distinguish between components that differ in name but not function. In the following discussion and in the claims, the terms "including" and "comprising" are used in an open-ended fashion, and thus should be interpreted to mean "including, but not limited to . . . ". The terms "couple" and "couples" are intended to mean either an indirect or a direct electrical connection. Thus, if a first device couples to a second device, that connection may be through a direct electrical connection, or through an indirect electrical connection via other devices and connections.

Figure 1:
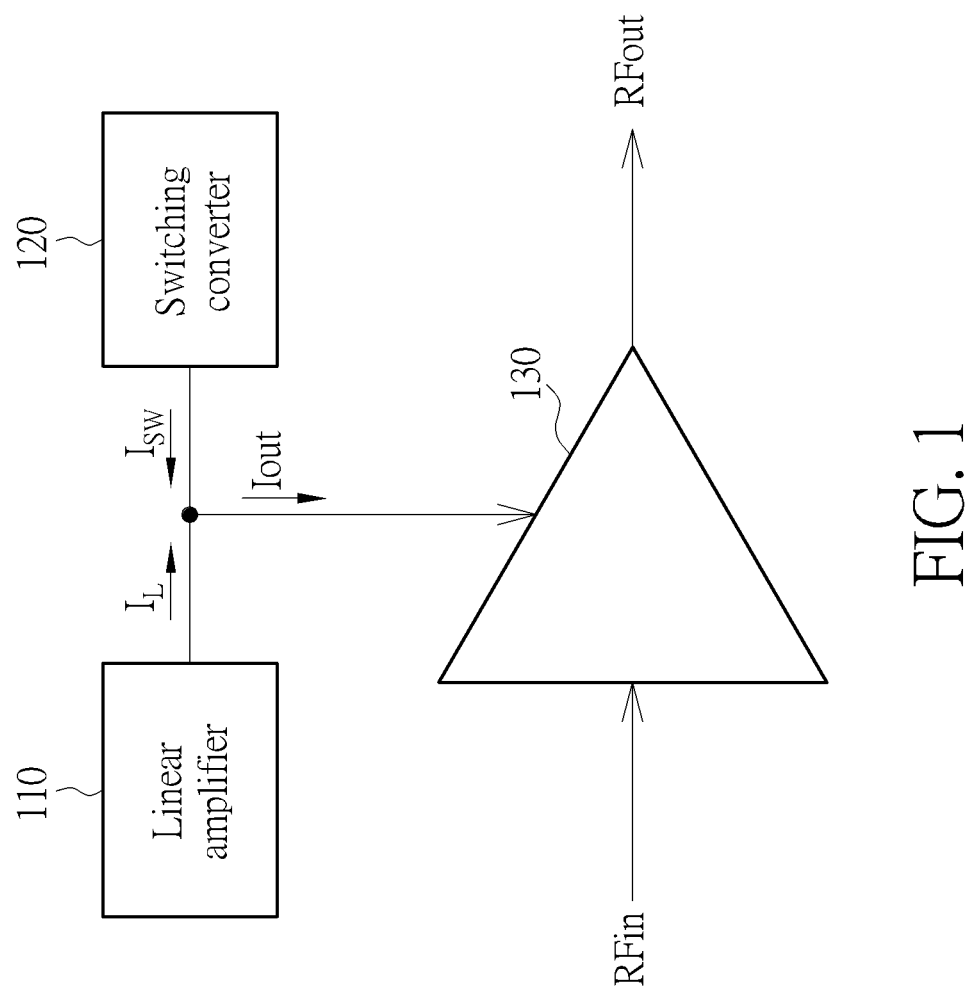
FIG. 1 is a diagram illustrating a supply modulator and a power amplifier according to one embodiment of the present invention.

FIG. 1 is a diagram illustrating a supply modulator and a power amplifier 130 according to one embodiment of the present invention, wherein the supply voltage comprises a linear amplifier 110 and a switching converter 120. As shown in FIG. 1, the power amplifier 130 is configured to receive a radio frequency input signal RFin to generate a radio frequency output signal RFout, and a supply voltage of the power amplifier 130 is generated by the linear amplifier 110 and the switching converter 120. Specifically, the switching converter 120 is configured to provide low-frequency current $I_{SW}$ with high efficiency, and the linear amplifier configured to provide high-frequency current $I_L$ with middle efficiency, and a summation of the current $I_{SW}$ and the current $I_L$ form an output current Iout flowing into the power amplifier 130.

Figure 2:
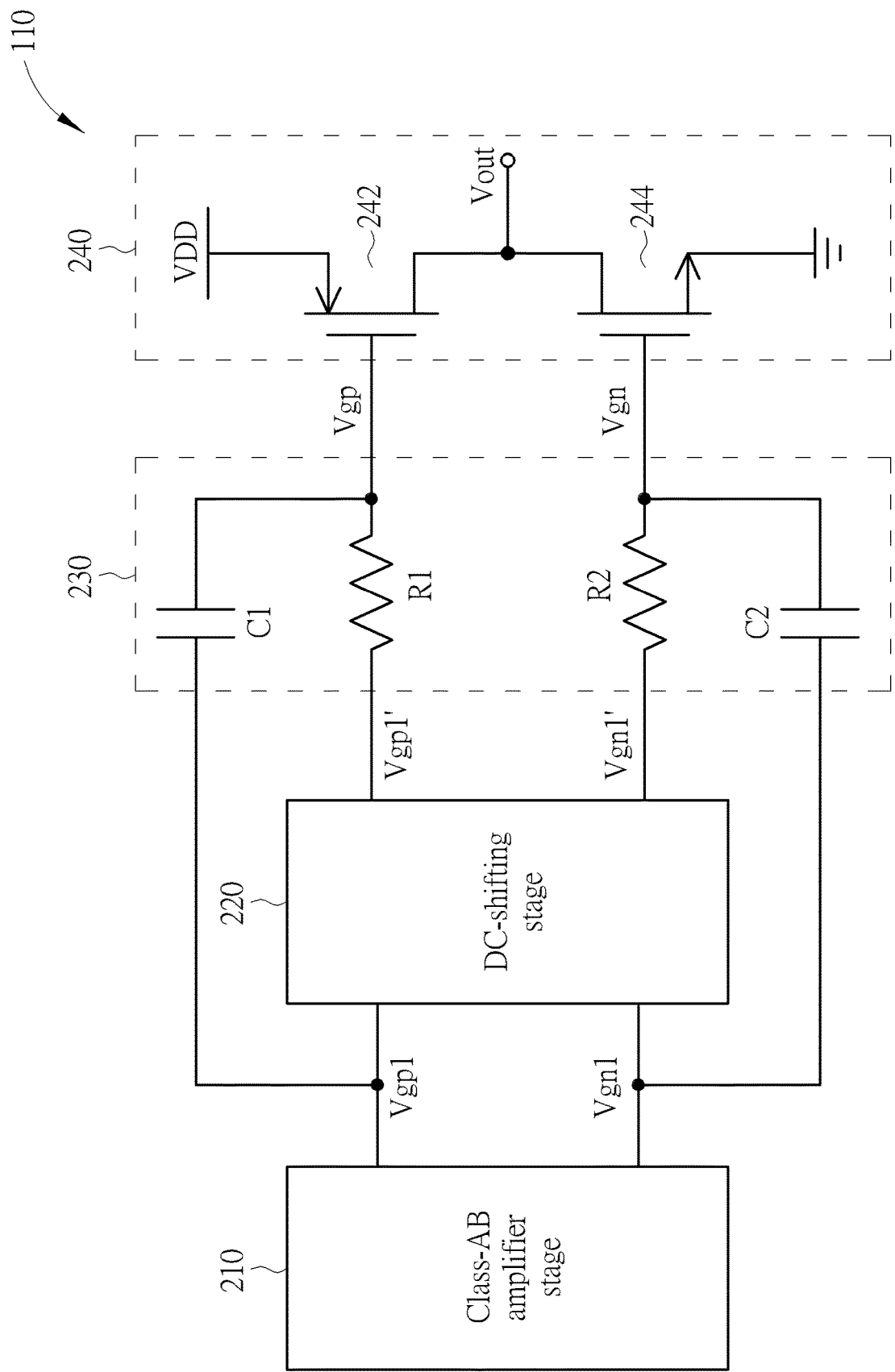
FIG. 2 is a diagram illustrating the linear amplifier according to one embodiment of the present invention.

FIG. 2 is a diagram illustrating the linear amplifier 110 according to one embodiment of the present invention. As shown in FIG. 2, the linear amplifier 110 comprises an amplifier stage (a class-AB amplifier stage 210 in this embodiment), a DC-shifting stage 220, a compensation network 230 and a power stage 240. The compensation network 230 comprises capacitors C1, C2 and resistors R1 and R2, and the power stage 240 comprises a P-type Metal-Oxide-Semiconductor (PMOS) 242 and an N-type Metal-Oxide-Semiconductor (NMOS) 244 connected between a supply voltage VDD and a ground voltage, wherein the capacitor C1 is coupled between a first output terminal of the class-AB amplifier stage 210 and a gate electrode of the PMOS 242, the capacitor C2 is coupled between a second output terminal of the class-AB amplifier stage 210 and a gate electrode of the NMOS 244, the resistor R1 is coupled between a first output terminal of the DC-shifting stage 220 and the gate electrode of the PMOS 242, and the resistor R2 is coupled between a second output terminal of the DC-shifting stage 220 and the gate electrode of the NMOS 244.

It is noted that the power stage 240 shown in FIG. 2 is for illustrative, not a limitation of the present invention. In other embodiments, one or more transistors/components may be positioned between the PMOS 242 and the supply voltage, and/or one or more transistors/components may be positioned between the PMOS 242 and the NMOS 244, and/or one or more transistors/components may be positioned between the NMOS 244 and the ground voltage.

In the operation of the linear amplifier 110, the class-AB amplifier stage 210 generates a first signal Vgp1 and a second signal Vgn1, wherein each of the first signal Vgp1 and the second signal Vgn1 has a DC part (DC voltage) and an AC part (AC signal). Then, the DC-shifting stage 220 adjusts a DC voltage of the first signal Vgp1 to generate an adjusted first signal Vgp1', wherein a DC voltage of the adjusted first signal Vgp1' is different from the DC voltage of the first signal Vgp1, and in this embodiment, the DC voltage of the adjusted first signal Vgp1' is higher than the DC voltage of the first signal Vgp1. The DC-shifting stage 220 further adjusts the DC voltage of the second signal Vgn1 to generate an adjusted second signal Vgn1', wherein a DC voltage of the adjusted second signal Vgn1' is different from the DC voltage of the second signal Vgn1, and in this embodiment, the DC voltage of the adjusted second signal Vgn1' is lower than the DC voltage of the second signal Vgn1.

Then, the compensation network 230 receives the first signal Vgp1 and the adjusted first signal Vgp1' to generate a first driving signal Vgp, wherein a DC voltage of the first driving signal Vgp is from the adjusted first signal Vgp1', and an AC signal of the adjusted first signal Vgp1' is from the first signal Vgp1. Specifically, for the adjusted first signal Vgp1', the resistor R1 and the capacitor C1 form a low-pass filter so that signal components below a −3 dB corner frequency of the resistor R1 and the capacitor C1 passes through the resistor R1; and for the first signal Vgp1, the capacitor C1 and the resistor R1 form a high-pass filter so that the signal components above the −3 dB corner frequency of the resistor R1 and the capacitor C1 passes through the capacitor C1; and the first driving signal Vgp is generated by combining a high-pass filtering result of the first signal Vgp1 and a low-pass filtering result of the adjusted first signal Vgp1'. Similarly, the compensation network 230 receives the second signal Vgn1 and the adjusted second signal Vgn1' to generate a second driving signal Vgn, wherein a DC voltage of the second driving signal Vgn is from the adjusted second signal Vgn1', and an AC signal of the adjusted second signal Vgn1' is from the second signal Vgn1. Specifically, for the adjusted second signal Vgn1', the resistor R2 and the capacitor C2 form a low-pass filter so that signal components below a −3 dB corner frequency of the resistor R2 and the capacitor C2 passes through the resistor R2; and for the second signal Vgn1, the capacitor C2 and the resistor R2 form a high-pass filter so that the signal components above the −3 dB corner frequency of the resistor R2 and the capacitor C2 passes through the capacitor C2; and the second driving signal Vgn is generated by combining a high-pass filtering result of the second signal Vgn1 and a low-pass filtering result of the adjusted second signal Vgn1'.

Then, the PMOS 242 and the NMOS 244 of the power stage 240 receives the first driving signal Vgp and the second driving signal Vgn, respectively, to generate an output signal Vout.

It is noted that the detailed circuits within the compensation network 230 are for illustrative, not a limitation of the present invention. As long as the compensation network 230 performs a high-pass filtering operation on the first signal Vgp1, performs a low-pass filtering operation on the adjusted first signal Vgp1', and combines a high-pass filtering result of the first signal Vgp1 and a low-pass filtering result of the adjusted first signal Vgp1' to generate the first driving signal Vgp; and/or compensation network 230 performs a high-pass filtering operation on the second signal Vgn1, performs a low-pass filtering operation on the adjusted second signal Vgn1', and combines a high-pass filtering result of the second signal Vgn1 and a low-pass filtering result of the adjusted second signal Vgn1' to generate the second driving signal Vgn, the compensation network 230 can have different circuit design.

In the above embodiment, by using the DC-shifting stage to de-couple the power stage and the class-AB amplifier stage, and using feedforward paths (i.e., R1/C1/R2/C2 in the compensation network 230) to apply AC-coupled feedforward to preserve the AC signal (i.e., class-AB signal), the first driving signal Vgp or the second driving signal Vgn can have appropriate DC voltage with enough AC swing. Specifically, in this embodiment, because the first driving signal Vgp has a higher DC voltage and/or the second driving signal Vgn has a lower DC voltage, the PMOS 242 and/or the NMOS 244 will have the smaller gate-source voltage (Vgs) so that the power stage 240 has smaller quiescent current. In addition, because the DC voltage the first signal Vgp1 can be lower than the DC voltage the adjusted first signal Vgp1', and/or the DC voltage the second signal Vgn1 can be higher than the DC voltage the adjusted second signal Vgn1', the linearity of the class-AB amplifier stage can have good linearity, and the swings of the first signal Vgp1 and the second signal Vgn1 are not worsened.

Figure 3:
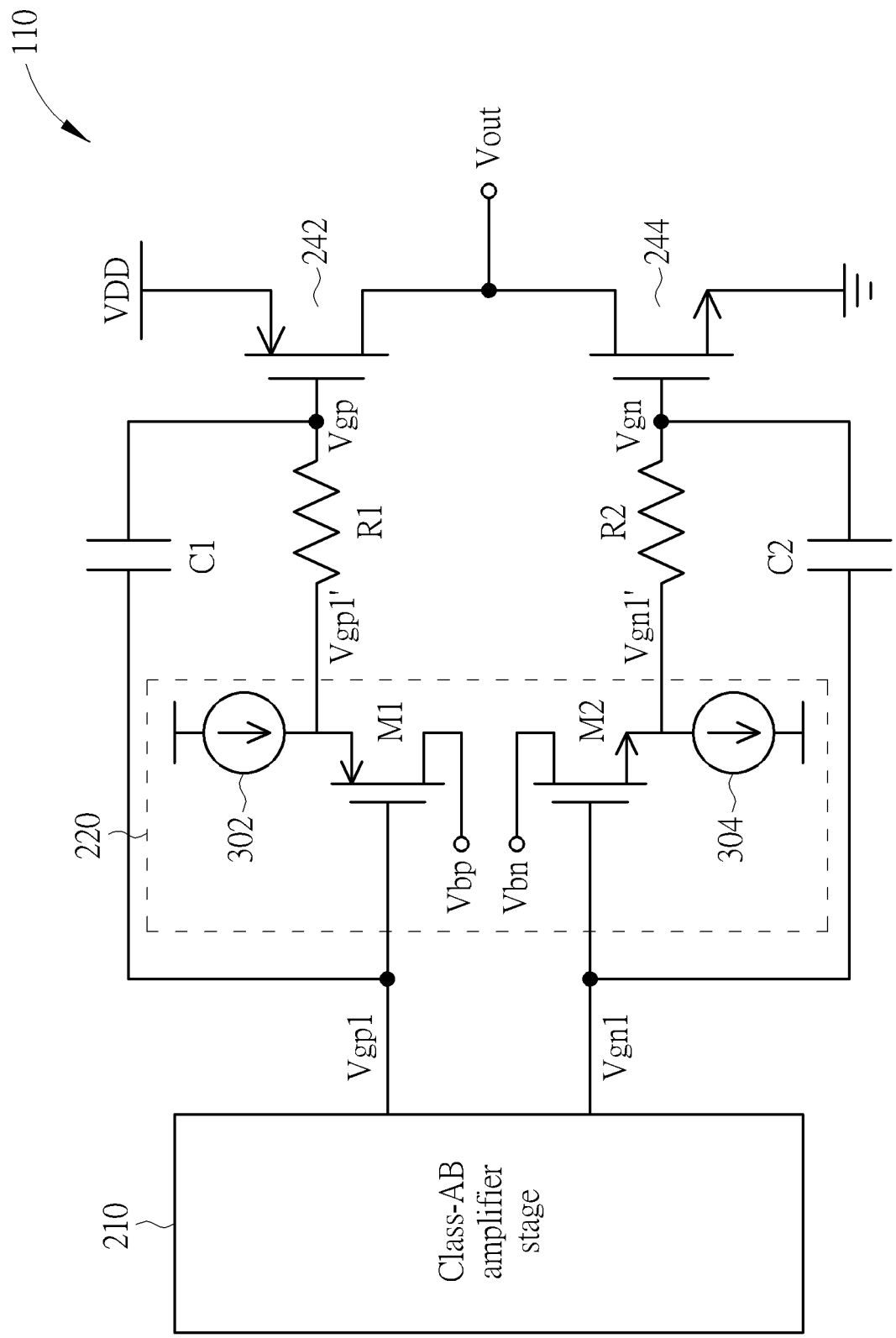
FIG. 3 is a diagram illustrating the DC-shifting stage according to one embodiment of the present invention.

FIG. 3 is a diagram illustrating the DC-shifting stage 220 according to one embodiment of the present invention. As shown in FIG. 3, the DC-shifting stage 220 is implemented by using source followers. Specifically, the DC-shifting stage 220 comprises a current source 302, a P-type transistor M1, an N-type transistor M2 and a current source 304, wherein the current source 302 is coupled between a supply voltage and a source electrode of the P-type transistor M1, a drain electrode of the P-type transistor M1 is coupled to a bias voltage Vbp, a drain electrode of the N-type transistor M2 is coupled to a bias voltage Vbn, and the current source 304 is coupled between the ground voltage and a source electrode of the N-type transistor M2. In the operation of the DC-shifting stage 220, the P-type transistor M1 serves as a source follower to receive the first signal Vgp1 at the gate electrode to generate the adjusted first signal Vgp1', and the N-type transistor M2 serves as a source follower to receive the second signal Vgn1 at the gate electrode to generate the adjusted second signal Vgn1'.

Figure 4:
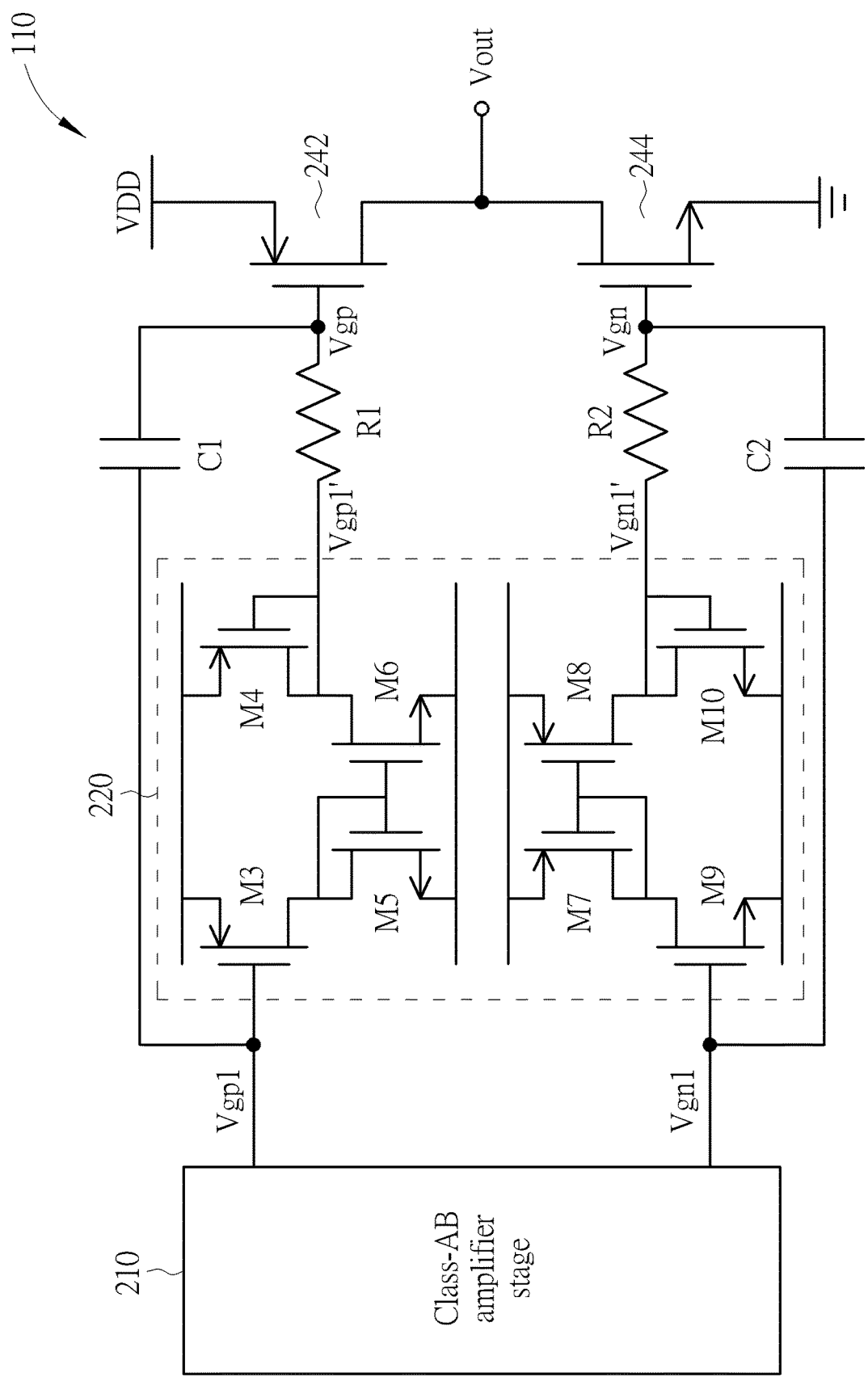
FIG. 4 is a diagram illustrating the DC-shifting stage according to one embodiment of the present invention.

FIG. 4 is a diagram illustrating the DC-shifting stage 220 according to one embodiment of the present invention. As shown in FIG. 4, the DC-shifting stage 220 is implemented by using common source amplifiers. Specifically, the DC-shifting stage 220 comprises a first common source amplifier and a second common source amplifier, wherein the first common source amplifier is implemented by using transistors M3-M6, and the second common source amplifier is implemented by using transistors M7-M10. In the operation of the DC-shifting stage, the first common source amplifier receives the first signal Vgp1 at a gate electrode of the transistor M3 to generate the adjusted first signal Vgp1' at a drain electrode of the transistor M4, and the second common source amplifier receives the second signal Vgn1 at a gate electrode of the transistor M9 to generate the adjusted second signal Vgn1' at a drain electrode of the transistor M10.

It is noted that the DC-shifting stage 220 shown in FIG. 3 and FIG. 4 is for illustrative, not a limitation of the present invention. As long as the DC-shifting stage 220 can adjust the voltage levels of the first signal Vgp1 and the second signal Vgn1 to generate the adjusted first signal Vgp1' and the adjusted second signal Vgn1', respectively, the DC-shifting stage 220 can have any suitable design.

Briefly summarized, in the linear amplifier of the present invention, by using the DC-shifting stage to de-couple the power stage and the amplifier stage, and using the compensation network to apply AC-coupled feedforward to preserve the AC signal, the first driving signal or the second driving signal inputted into the power stage can have appropriate DC voltage with enough AC swing. Therefore, the linear amplifier can have good linearity with low quiescent current.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A linear amplifier, comprising:
an amplifier stage, configured to generate a first signal and a second signal;
a DC-shifting stage, configured to adjust a DC voltage of the first signal and a DC voltage of the second signal to generate an adjusted first signal and an adjusted second signal;
a compensation network, configured to generate a first driving signal and a second driving signal according to the first signal, the second signal, the adjusted first signal and the adjusted second signal; and
a power stage, configured to generate an output signal according to the first driving signal and the second driving signal;
wherein the compensation network performs a high-pass filtering operation on the first signal, performs a low-pass filtering operation on the adjusted first signal, and combines a high-pass filtering result of the first signal and a low-pass filtering result of the adjusted first signal to generate the first driving signal.

2. The linear amplifier of claim 1, wherein a DC voltage of the adjusted first signal is different from the DC voltage of the first signal, and a DC voltage of the adjusted second signal is different from the DC voltage of the second signal.

3. The linear amplifier of claim 2, wherein the DC voltage of the adjusted first signal is higher than the DC voltage of the first signal, and the DC voltage of the adjusted second signal is lower than the DC voltage of the second signal.

4. The linear amplifier of claim 3, wherein the compensation network generates the first driving signal according to the first signal and the adjusted first signal, and generates the second driving signal according to the second signal and the adjusted second signal; the power stage comprises a P-type transistor and an N-type transistor connected in series, and a gate electrode of the P-type transistor receives the first driving signal and a gate electrode of the N-type transistor receives the second driving signal to generate the output signal.

5. The linear amplifier of claim 1, wherein the compensation network comprises a first feedforwad path to preserve an AC component of the first signal in the first driving signal, and the compensation network comprises a second feedforwad path to preserve an AC component of the second signal in the second driving signal.

6. The linear amplifier of claim 1, wherein the amplifier stage is a class-AB amplifier stage.

7. The linear amplifier of claim 1, wherein the linear amplifier is used in a supply modulator.

8. A linear amplifier, comprising:
an amplifier stage, configured to generate a first signal and a second signal;
a DC-shifting stage, configured to adjust a DC voltage of the first signal and a DC voltage of the second signal to generate an adjusted first signal and an adjusted second signal;
a compensation network, configured to generate a first driving signal and a second driving signal according to the first signal, the second signal, the adjusted first signal and the adjusted second signal; and
a power stage, configured to generate an output signal according to the first driving signal and the second driving signal;
wherein the compensation network performs a high-pass filtering operation on the second signal, performs a low-pass filtering operation on the adjusted second signal, and combines a high-pass filtering result of the second signal and a low-pass filtering result of the adjusted second signal to generate the second driving signal.

9. A linear amplifier, comprising:
an amplifier stage, configured to generate a first signal and a second signal;
a DC-shifting stage, configured to adjust a DC voltage of the first signal and a DC voltage of the second signal to generate an adjusted first signal and an adjusted second signal;
a compensation network, configured to generate a first driving signal and a second driving signal according to the first signal, the second signal, the adjusted first signal and the adjusted second signal; and
a power stage, configured to generate an output signal according to the first driving signal and the second driving signal;
wherein the compensation network comprises a first capacitor and a first resistor, a first node of the first capacitor is used to receive the first signal, a first node of the first resistor is used to receive the adjusted first signal, and a second node of the first capacitor is coupled to a second node of the first resistor; and the first driving signal is generated at the second node of the first capacitor or the second node of the first resistor.

10. A linear amplifier, comprising:
an amplifier stage, configured to generate a first signal and a second signal;
a DC-shifting stage, configured to adjust a DC voltage of the first signal and a DC voltage of the second signal to generate an adjusted first signal and an adjusted second signal;
a compensation network, configured to generate a first driving signal and a second driving signal according to the first signal, the second signal, the adjusted first signal and the adjusted second signal; and
a power stage, configured to generate an output signal according to the first driving signal and the second driving signal;
wherein the compensation network comprises a second capacitor and a second resistor, a first node of the second capacitor is used to receive the second signal, a first node of the second resistor is used to receive the adjusted second signal, and a second node of the second capacitor is coupled to a second node of the second resistor; and the second driving signal is generated at the second node of the second capacitor or the second node of the second resistor.

* * * * *